(12) United States Patent
West et al.

(10) Patent No.: US 10,003,287 B2
(45) Date of Patent: Jun. 19, 2018

(54) MAGNET DEGRADATION AND DAMAGE CONTROLS AND DIAGNOSTICS FOR PERMANENT MAGNET MOTORS

(71) Applicant: Trane International Inc., Piscataway, NJ (US)

(72) Inventors: Nathan Thomas West, Oak Creek, WI (US); David Marshall Foye, LaCrosse, WI (US)

(73) Assignee: Trane International Inc., Piscataway, NJ (US)

( * ) Notice: Subject to any disclaimer, the term of this patent is extended or adjusted under 35 U.S.C. 154(b) by 0 days. days.

(21) Appl. No.: 15/450,999

(22) Filed: Mar. 6, 2017

(65) Prior Publication Data

US 2017/0179859 A1    Jun. 22, 2017

Related U.S. Application Data

(63) Continuation of application No. 14/751,481, filed as application No. PCT/US2014/010045 on Jan. 2, 2014, now Pat. No. 9,647,591.

(Continued)

(51) Int. Cl.
*H02P 6/14* (2016.01)
*H02P 29/66* (2016.01)
(Continued)

(52) U.S. Cl.
CPC .............. *H02P 6/14* (2013.01); *G01R 31/343* (2013.01); *H02P 21/14* (2013.01); *H02P 29/024* (2013.01); *H02P 29/662* (2016.11)

(58) Field of Classification Search
CPC .... H02P 21/00; H02P 1/00; H02P 6/00; H02P 23/00; H02P 27/00; H02P 27/04;
(Continued)

(56) References Cited

U.S. PATENT DOCUMENTS

| 4,282,473 A | 8/1981 | Dreiseitl et al. |
| 4,879,497 A | 11/1989 | Meyer et al. |

(Continued)

FOREIGN PATENT DOCUMENTS

| EP | 2182620 | 5/2010 |
| JP | 2004257879 | 9/2004 |
| WO | 2011019695 | 2/2011 |

OTHER PUBLICATIONS

US/RO International Search Report and Written Opinion, PCT/US2014/010045, Trane International Inc., dated May 13, 2015, 16 pgs.

(Continued)

*Primary Examiner* — Antony M Paul
(74) *Attorney, Agent, or Firm* — Taft Stettinius & Hollister LLP

(57) ABSTRACT

Techniques for motor magnet degradation controls and diagnostics are disclosed. An exemplary technique determines q-axis current, d-axis current, q-axis voltage, and/or d-axis voltage of a permanent magnet motor based upon sensed current and voltage information of the motor. This information is utilized to determine flux information. The flux information is utilized in evaluating collective state conditions of a plurality of motor magnets and evaluating localized state conditions of a subset of the plurality of motor magnets. The evaluations can be used to identify degradation or damage to one or more of the magnets which may occur as a result of elevated temperature conditions, physical degradation, or chemical degradation.

18 Claims, 5 Drawing Sheets

Related U.S. Application Data

(60) Provisional application No. 61/748,231, filed on Jan. 2, 2013.

(51) Int. Cl.
*H02P 29/024* (2016.01)
*H02P 21/14* (2016.01)
*G01R 31/34* (2006.01)

(58) Field of Classification Search
CPC ........ H02P 27/06; H02P 21/14; H02P 21/141;
H02P 29/024; G05B 5/00; G01R 31/343;
G05D 23/00
USPC .......... 318/471, 472, 473, 400.01, 700, 701,
318/727, 400.14, 799, 800, 801, 430, 432,
318/490; 310/49.28, 49.32, 152, 154.32,
310/156.01
See application file for complete search history.

(56) References Cited

U.S. PATENT DOCUMENTS

| | | | |
|---|---|---|---|
| 6,034,458 A | 3/2000 | Uetake | |
| 6,566,840 B1 | 5/2003 | Wu et al. | |
| 7,071,649 B2 | 7/2006 | Shafer et al. | |
| 7,099,793 B2 | 8/2006 | Rechberger | |
| 7,392,158 B2 | 6/2008 | Hikawa et al. | |
| 7,679,308 B2 * | 3/2010 | Tomigashi | H02P 21/14 318/400.02 |
| 7,696,657 B2 | 4/2010 | Dooley | |
| 7,979,171 B2 | 7/2011 | Wu et al. | |
| 8,179,068 B2 * | 5/2012 | Yuuki | H02K 1/2766 318/432 |
| 8,222,844 B2 | 7/2012 | Eisenhardt | |
| 8,242,722 B2 * | 8/2012 | Matsui | B60L 11/14 318/400.04 |
| 8,552,678 B2 * | 10/2013 | Yuuki | H02K 1/2766 318/432 |
| 8,912,739 B2 * | 12/2014 | Kobayashi | H02P 29/662 318/400.02 |
| 2006/0250154 A1 * | 11/2006 | Gao | G01R 31/343 324/765.01 |
| 2009/0229280 A1 | 9/2009 | Doty et al. | |
| 2010/0276929 A1 * | 11/2010 | Jansen | G01K 7/42 290/44 |
| 2012/0091848 A1 * | 4/2012 | Sakai | H02K 1/2766 310/156.43 |
| 2015/0357955 A1 | 12/2015 | West | |

OTHER PUBLICATIONS

Roux, Wiehn Le et al. "Detecting Rotor Faults in Permanent Magnet Synchronous Machines", Symposium on Diagnostics for Electric Machines Power Electronics and Drives, Atlanta, GA, Aug. 2003, pp. 198-203.

* cited by examiner

MAGNET DEGRADATION AND DAMAGE CONTROLS AND DIAGNOSTICS FOR PERMANENT MAGNET MOTORS

RELATED APPLICATIONS

This application is a U.S. continuation of U.S. patent application Ser. No. 14/751,481 filed on Jun. 26, 2015, which is a continuation of PCT Application No. PCT/US2014/10045 filed Jan. 2, 2014, which claims priority to U.S. Provisional Application No. 61/748,231 filed on Jan. 2, 2013, the contents of which are incorporated herein by reference.

BACKGROUND

Permanent magnet motors offer significant potential benefits for applications in which an electric motor is utilized to drive a refrigerant compressor including enhanced efficiency, power density, and speed control precision. Such motors also present controls and diagnostic challenges. The temperature of the magnetic material of such motors must be controlled to avoid damage from elevated temperature conditions which can arise, for example, from inadequate cooling or increased stator or rotor loss. Furthermore, some applications present a risk of chemical or mechanical attack on the magnets. Conventional techniques for controlling and diagnosing permanent magnet motors suffer from a number of shortcomings including imprecision, computational complexity and inefficiency, frequency dependence, response speed, and microprocessor-burdening division operations, among other shortcomings. There is a need for the unique and inventive controls and diagnostics disclosed herein.

DISCLOSURE

For the purposes clearly, concisely and exactly describing exemplary embodiments of the invention, the manner and process of making and using the same, and to enable the practice, making and use of the same, reference will now be made to certain exemplary embodiments, including those illustrated in the figures, and specific language will be used to describe the same. It shall be understood that no limitation of the scope of the invention is thereby created, and that the invention includes and protects such alterations, modifications, and further applications of the exemplary embodiments as would occur to one skilled in the art to which the invention relates.

SUMMARY

Unique controls and diagnostic techniques for permanent magnet motor magnet degradation and damage controls and diagnostics are disclosed. Certain exemplary embodiments determine q-axis current, d-axis current, q-axis voltage, and/or d-axis voltage of a permanent magnet motor based upon sensed current and voltage information of the motor and utilize this information to determine flux information. The flux information may be utilized in evaluating collective state conditions of a plurality of motor magnets and evaluating localized state conditions of a subset of the plurality of motor magnets. The evaluations can be used to identify degradation or damage to one or more of the magnets which may occur as a result of elevated temperature conditions, physical degradation, or chemical degradation. Further embodiments, forms, objects, features, advantages, aspects, and benefits shall become apparent from the following description and drawings.

DETAILED DESCRIPTION

Figure 1:
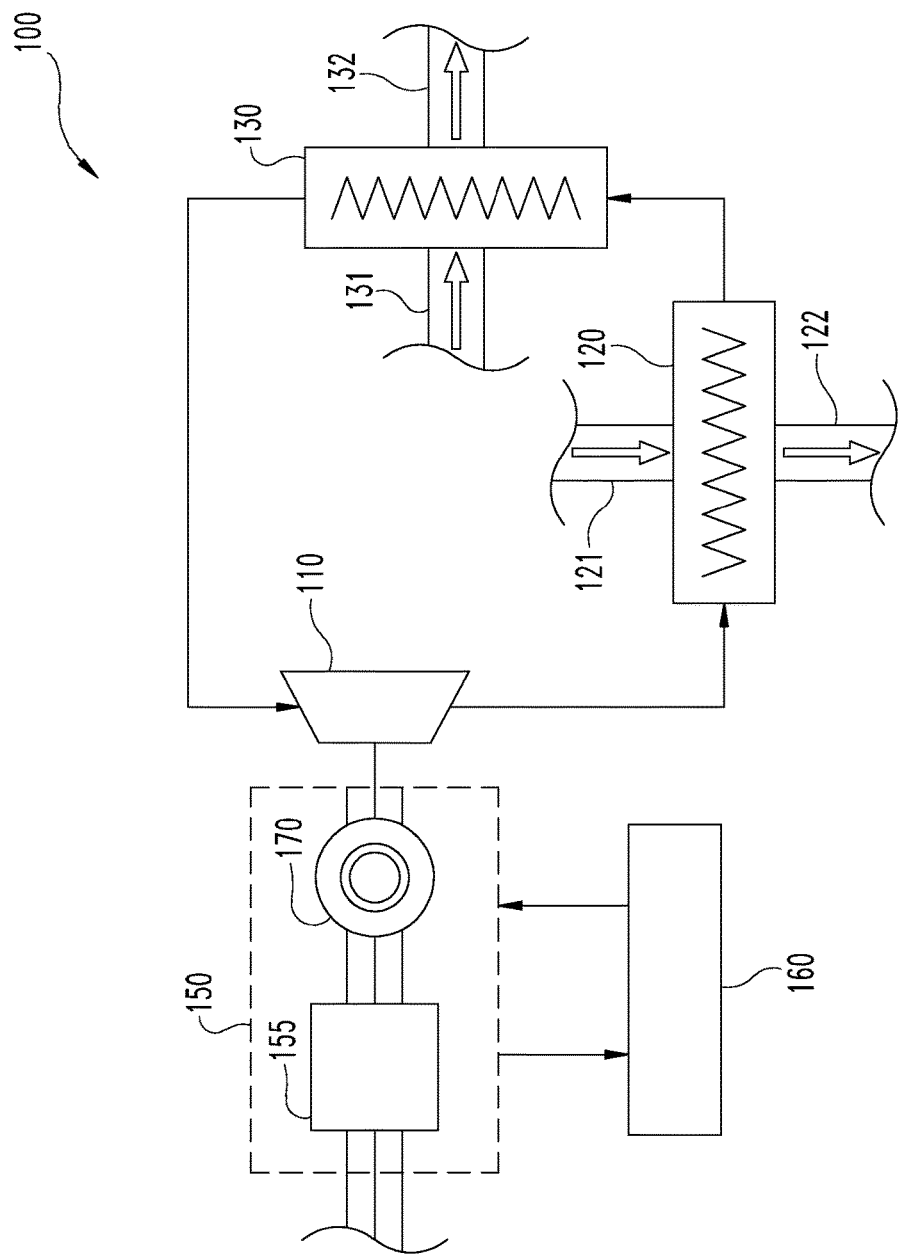
FIG. 1 is a schematic of an exemplary chiller system.

With reference to FIG. 1 there is illustrated an exemplary chiller system 100 which includes a refrigerant loop comprising a compressor 110, a condenser 120, and an evaporator 130. Refrigerant flows through system 100 in a closed loop from compressor 110 to condenser 120 to evaporator 130 and back to compressor 110. Various embodiments may also include additional refrigerant loop elements including, for example, valves for controlling refrigerant flow, refrigerant filters, economizers, oil separators and/or cooling components and flow paths for various system components.

Compressor 110 is driven by a drive unit 150 including a permanent magnet electric motor 170 which is driven by a variable frequency drive 155. In the illustrated embodiment, variable frequency drive 155 is configured to output a three-phase PWM drive signal, and motor 170 is a surface magnet permanent magnet motor. Use of other types and configurations of variable frequency drives and permanent magnet electric motors such as interior magnet permanent magnet motors are also contemplated. It shall be appreciated that the principles and techniques disclosed herein may be applied to a broad variety of drive and permanent magnet motor configurations.

Condenser 120 is configured to transfer heat from compressed refrigerant received from compressor 110. In the illustrated embodiment condenser 120 is a water cooled condenser which receives cooling water at an inlet 121, transfers heat from the refrigerant to the cooling water, and outputs cooling water at an output 122. It is also contemplated that other types of condensers may be utilized, for example, air cooled condensers or evaporative condensers. It shall further be appreciated that references herein to water include water solutions comprising additional constituents unless otherwise limited.

Evaporator 130 is configured to receive refrigerant from condenser 120, expand the received refrigerant to decrease its temperature and transfer heat from a cooled medium to the refrigerant. In the illustrated embodiment evaporator 130 is configured as a water chiller which receives water provided to an inlet 131, transfers heat from the water to the refrigerant, and outputs chilled water at an outlet 132. It is contemplated that a number of particular types of evaporators and chiller systems may be utilized, including dry expansion evaporators, flooded type evaporators, bare tube evaporators, plate surface evaporators, and finned evaporators among others.

Chiller system 100 further includes a controller 160 which outputs control signals to variable frequency drive 155 to control operation of the motor 170 and compressor 110. Controller 160 also receives information about the operation of drive unit 150. In exemplary embodiments controller 160 receives information relating to motor current, motor terminal voltage, and/or other operational characteristics of the motor. It shall be appreciated that the controls, control routines, and control modules described herein may be implemented using hardware, software, firmware and various combinations thereof and may utilize executable instructions stored in a non-transitory computer readable medium or multiple non-transitory computer readable media. It shall further be understood that controller 160 may be provided in various forms and may include a number of hardware and software modules and components such as those disclosed herein.

Figure 2:
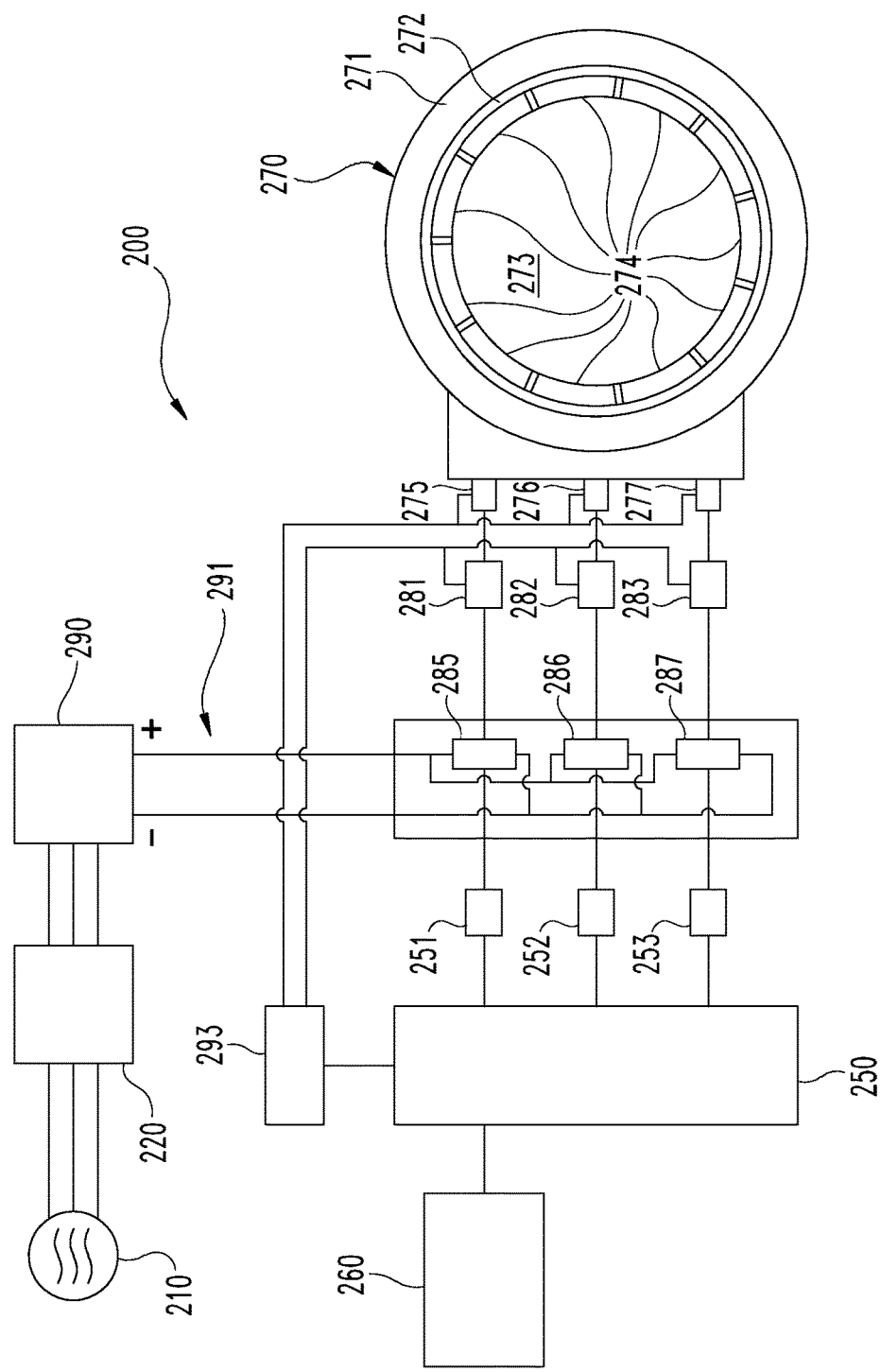
FIG. 2 is a schematic of an exemplary variable frequency drive and permanent magnet motor.

With reference to FIG. 2 there is illustrated an exemplary circuit diagram for a variable frequency drive 200. Drive 200 is connected to a power source 210, for example, a 400/480 VAC utility power supply which provides three-phase AC power to line filter module 220. Line filter module 220 is configured to provide harmonic damping to mitigate losses which can arise from harmonic feedback from drive components to power source 210. Line filter module 220 outputs three-phase AC power to a rectifier 290 which converts the AC power to DC power and provides the DC power to a DC bus 291. The DC bus is connected to inverter 280. For clarity of illustration and description, rectifier 290, DC bus 291, and inverter 280 are shown as discrete blocks. It shall be appreciated, however, that two or more of these components may be provided in a common module, board or board assembly which may also include a variety of additional circuitry and components. It shall be further understood that multiple pulse rectifiers such as 12-pulse, 18-pulse, 24-pulse or 30-pulse rectifiers may be utilized along with phase shifting transformers providing appropriate phase inputs for 6-pulse 12-pulse, 18-pulse, 24-pulse, or 30-pulse operation.

Inverter module 280 includes switches 285, 286 and 287 which are connected to the positive and negative lines of the DC bus 291. Switches 285, 286 and 287 are preferably configured as IGBT and diode based switches, but may also utilize other types of power electronics switching components such as power MOSFETs or other electrical switching devices. Switches 285, 286 and 287 provide output to motor terminals 275, 276 and 277. Current sensors 281, 282 and 283 are configured to detect current flowing from inverter module 280 to motor 270 and send current information to ID module 293. Voltage sensors are also operatively coupled with motor terminals 275, 276 and 277 and configured to provide voltage information from the motor terminals to ID module 293.

ID module 293 includes burden resistors used in connection with current sensing to set the scaling on current signals ultimately provided to analog to digital converters for further processing. ID module 293 tells the VFD what size it is (i.e. what type of scaling to use on current post ADC) using identification bits which are set in hardware on the ID module 293. ID module 293 also outputs current and voltage information to gate drive module 250 and also provides identification information to gate drive module 250 which identifies the type and size of the load to which gate drive module 250 is connected. ID module 293 may also provide current sensing power supply status information to gate drive module 250. ID module 293 may also provide scaling functionality for other parameters such as voltage or flux signals in other embodiments.

Gate drive module 250 provides sensed current and voltage information to analog to digital converter inputs of DSP module 260. DSP module 260 processes the sensed current and voltage information and also provides control signals to gate drive module 250 which control signals gate drive module 250 to output voltages to boost modules 251, 252 and 253, which in turn output boosted voltages to switches 285, 286 and 287. The signals provided to switches 285, 286 and 287 in turn control the output provided to terminals 275, 276 and 277 of motor 270.

Motor 270 includes a stator 271, a rotor 273, and an air gap 272 between the rotor and the stator. Motor terminals 275, 276 and 277 are connected to windings provided in stator 271. Rotor 273 includes a plurality of permanent magnets 274. In the illustrated embodiment magnets 274 are configured as surface permanent magnets positioned about the circumference of rotor 273. The rotor is typically constructed using the permanent magnets in such a way as essentially a constant magnetic flux is present at the surface of the rotor. In operation with rotation of the rotor, the electrical conductors forming the windings in the stator are disposed to produce a sinusoidal flux linkage. Other embodiments also contemplate the use of other magnet configurations such as interior magnet configurations. It shall be understood that interior magnet configurations typically have different inductances in the q-axis and the d-axis.

Figure 3:
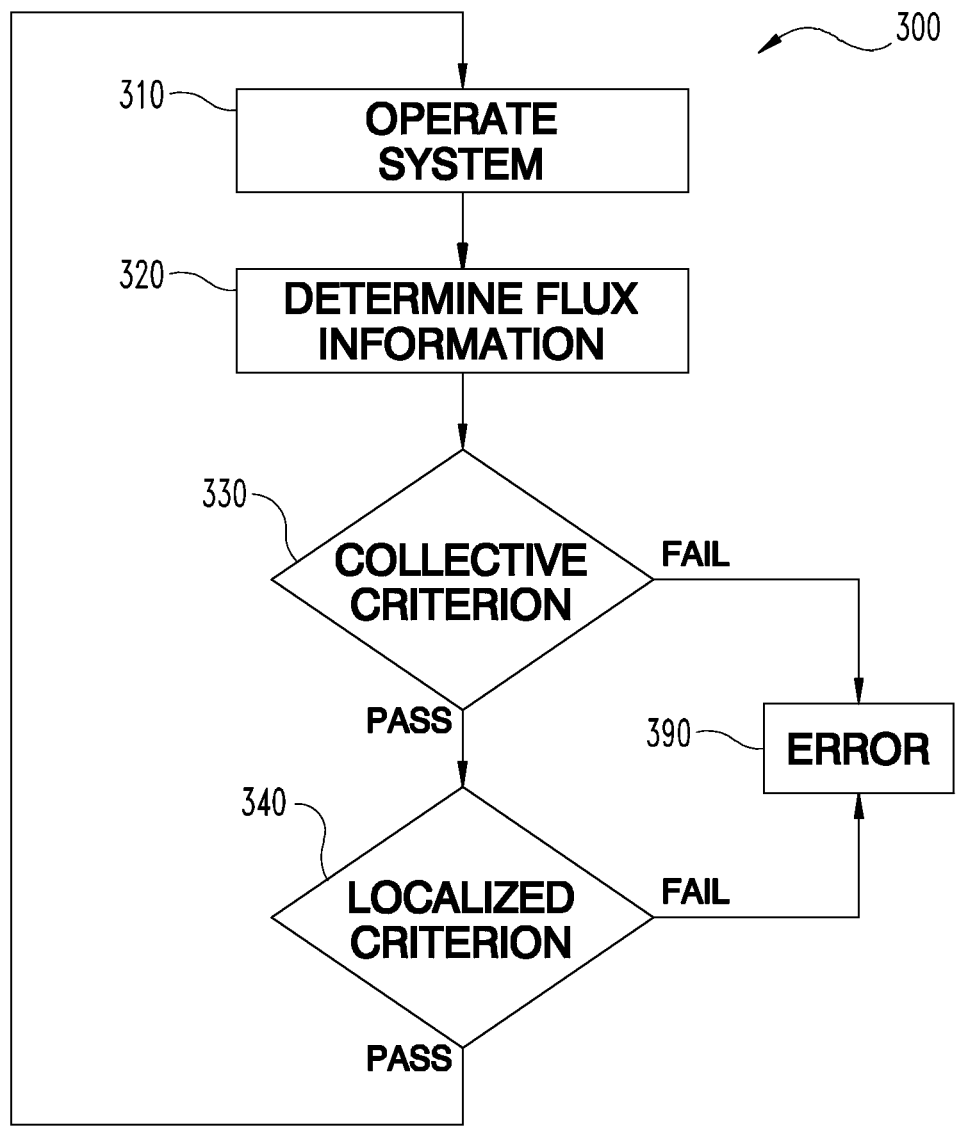
FIGS. 3 and 4 are flow diagrams illustrating exemplary control and diagnostic processes.

With reference to FIG. 3 there is illustrated a flow diagram 300 according to exemplary control and diagnostic process 300 which is preferably implemented in a microprocessor-based control module such as DSP module 260 illustrated and described above in connection with FIG. 2. Process 300 begins at operation 310 where a controller is operated to control a drive for a permanent magnet motor. In a preferred form the controller is configured to provide control signals to a variable frequency drive which outputs a PWM signal to drive a synchronous surface permanent magnet motor including a plurality of permanent magnets positioned about the circumference of the rotor. In other embodiments other types of motors, such as motors with interior rotor magnets may be utilized, and alternate motor drives may be used.

From operation 310 process 300 proceeds to operation 320 where the controller determines flux information associated with the motor. In a preferred form the flux information is determined by the controller programmed to calculate the q-axis flux information in accordance with Equation 1:

$$Fq=\int(Vq-(Iq*Rs))dt-(Id*Ld) \qquad (1)$$

In Equation 1 F is the q-axis flux information to be determined, Vq is the q-axis motor voltage, Iq is the q-axis motor current, Id is the d-axis motor current, Ld is the d-axis motor inductance, and Rs is the motor stator resistance. It shall be appreciated that microprocessor-based implementations of Equation 1 may be provided using a variety of control hardware, software and combinations thereof.

It shall be appreciated that a relationship analogous to that defined by Equation 1 may also be described for d-axis flux information in accordance with Equation 2:

$$Fd=\int(Vd-(Id*Rs))dt-(Iq*Lq) \qquad (2)$$

In Equation 2 Fd is the d-axis flux information to be determined, Vd is the d-axis motor voltage, Id is the d-axis motor current, Iq is the d-axis motor current, Lq is the d-axis motor inductance, and Rs is the motor stator resistance. It shall be appreciated that microprocessor-based implementations of Equation 2 may be provided using a variety of control hardware, software and combinations thereof.

In a preferred form the controller is configured to determine at least Vq, Iq, and Id, or at least Vd, Id, and Iq based upon sensed motor current and voltage information by executing a dq0 (d-axis, q-axis, zero-axis) transform, and Rs and Ld or Lq are predetermined constants. In other forms Ld, Lq, and/or Rs may be determined by the controller based upon motor operation information. Additionally, for computational efficiency, the zero component of the dq0 transform may be assumed to be zero and omitted.

It shall be appreciated that the general relationship defined by equation 1 may also be applied to reference frames other than the dq0 coordinate system. For example, the reference frame could be the rotor reference frame, the stationary reference frame, or the electrical reference frame in different embodiments. For simplicity the disclosure herein refers to the dq0 coordinate system, however, it shall be understood that this description is equally applicable to and encompasses the aforementioned alternate reference frames as well.

From operation 320 the process proceeds to conditional 330 which evaluates the determined flux information relative to a criterion associated with the plurality of magnets collectively. In a preferred form, the flux information is determined in real time and averaged over a predetermined time interval to provide an averaged flux value that is representative of the plurality of magnets collectively or in bulk. In certain exemplary embodiments the flux information is filtered over time to provide a moving or rolling average. In certain exemplary embodiments the average flux information may be determined as the RMS of the flux information. The averaged flux information is then evaluated against a threshold. The threshold may be a predetermined value such as an engineering value that is defined for a class of designs, a value that is determined for individual machines during manufacture or assembly, a value that is adjusted in the field by a technician as the machine is used, or a value that is learned by an artificial intelligence algorithm which adjusts the threshold or approach parameter based upon feedback from iterative operations using predetermined boundaries as a guideline. In certain embodiments a system is initialized to a measured flux value at time of manufacture and this value is stored in a non-transitory computer readable medium and is used as a reference value against which flux decreases due to damage or temperature are judged. In certain embodiments a system characterized at time of manufacture as to the instantaneous flux function of the motor, against which flux decreases due to damage or temperature are judged.

If conditional 330 determines that the averaged flux information is below the threshold, it provides a fail output to operation 390 where the controller commands the motor and drive to stop or de-rate operation and stores an error condition code. If conditional 330 determines that the averaged flux information is below the threshold, it provides a pass output and process 300 proceeds to conditional 340 which evaluates the determined flux information relative to a criterion associated with a localized subset of the plurality of magnets. In a preferred form, the flux information is determined in real time and compared to an instantaneous or localized flux threshold. If conditional 340 determines that the flux information is below the threshold, it provides a fail output to operation 390 where the controller commands the motor and drive to stop or de-rate operation and stores an error condition code. If conditional 340 determines that the flux information is below the threshold, process 300 returns to operation 310 and repeats. In additional forms a Fourier transform such as an FFT, is performed to extract harmonic information from the measured flux signal. Since the flux signal is sinusoidal, the appearance of significant higher order harmonics may be utilized as indications of localized damage, or over temperature conditions.

It shall be appreciated that a number of different phenomena may result in fail conditions for conditionals 330 and 340. For example, magnet over-temperature conditions, chemical degradation or damage to the magnet, or physical degradation or damage to a magnet may result in averaged flux information that generates a fail condition. It shall be further appreciated that the flux information may be further processed prior to performing the above evaluations, for example, by conversion to temperature information using a constant correlating the flux information with magnet temperature. Additionally, it shall be appreciated that conditionals 330 and 340 may be performed in the opposite order or in parallel.

Figure 4:
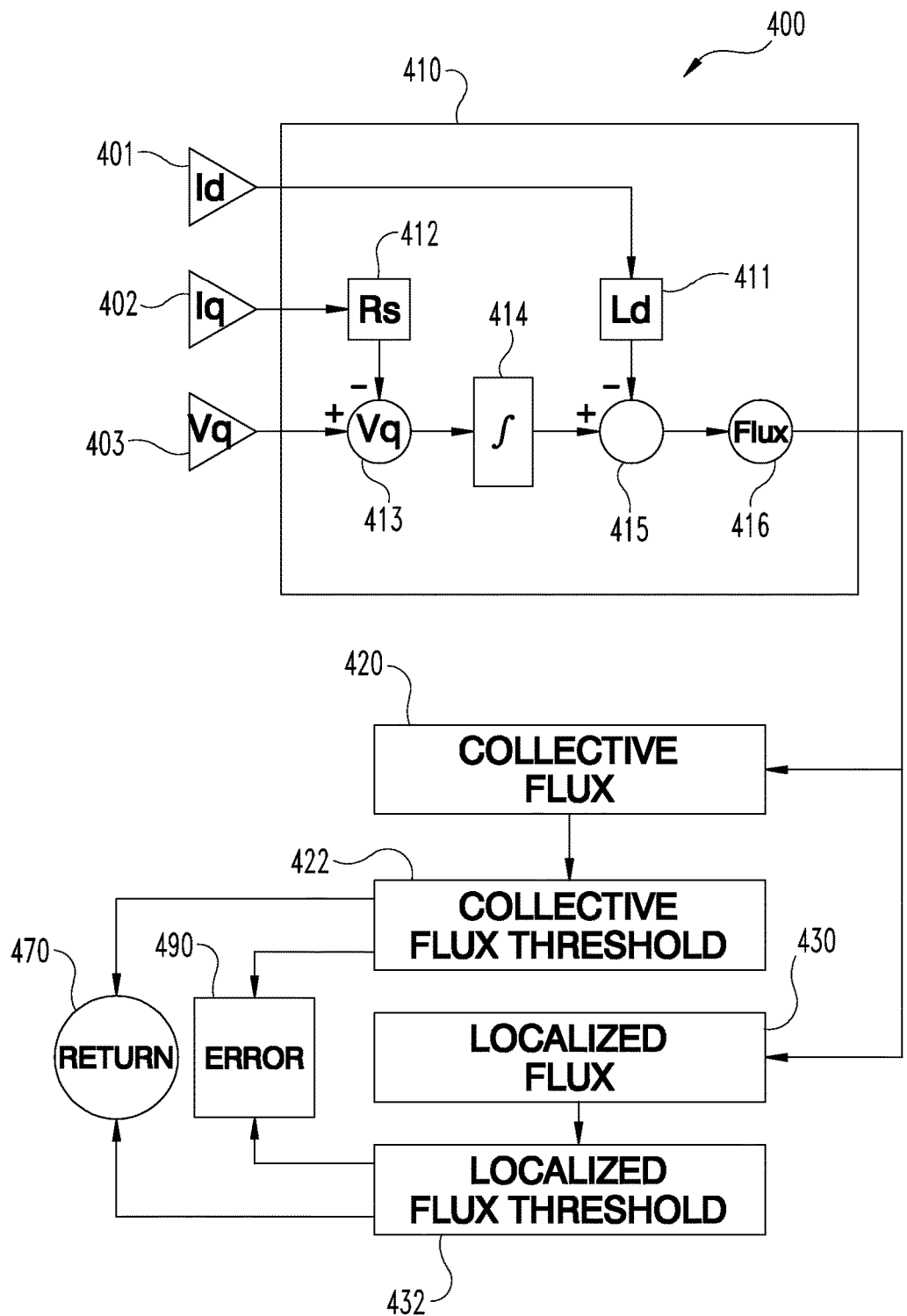

With reference to FIG. 4 there is illustrated a flow diagram according to exemplary control and diagnostic process 400 which is preferably implemented in a microprocessor-based control module. Process 400 begins at operation 410 which receives d-axis current information Id at input 401, q-axis current information Iq at input 402 and q-axis current information Vq at input 403. Operator 412 multiplies Iq with Rs and outputs to operator 413. Operator 413 subtracts the output of operator 412 from Vq and outputs to operator 414 which integrates its input with respect to time and outputs to operator 415. Operator 411 multiplies the Id and Ld and outputs to operator 415. Operator 415 subtracts the output of operator 411 from the integrated output of operator 414 and the resulting flux information output is provided to operator 416, for example, a shutdown threshold, a de-rate threshold, or both.

The flux information of operator 416 is provided to operator 420 which processes the flux information to determine collective flux information attributable to the plurality of magnets collectively, for example, using techniques such as those disclosed herein above. Operator 420 outputs the collective flux information to operator 422 which evaluates the collective flux information relative to one or more collective criteria. If the collective flux information satisfies the collective criteria, process 400 proceeds to operation 470 which returns to operation 410. If the collective flux information does not satisfy the collective criteria, process 400 proceeds to operation 490 where the controller commands the motor and drive to stop or de-rate operation and stores an error condition code and/or de-rates or shuts down the system.

The flux information of operator 416 is also provided to operator 430 which processes the flux information to determine localized flux information attributable to a localized region or subset of the plurality of magnets, for example, using techniques such as those disclosed herein above. Operator 430 outputs the localized flux information to operator 432 which evaluates the localized flux information relative to one or more criteria, for example, a shutdown threshold, a de-rate threshold or both. If the localized flux information satisfies the localized criteria, process 400 proceeds to operation 470 which returns to operation 410. If the localized flux information does not satisfy the localized criteria, process 400 proceeds to operation 490 where the controller commands the motor and drive to stop or de-rate operation and stores an error condition code.

Figure 5:
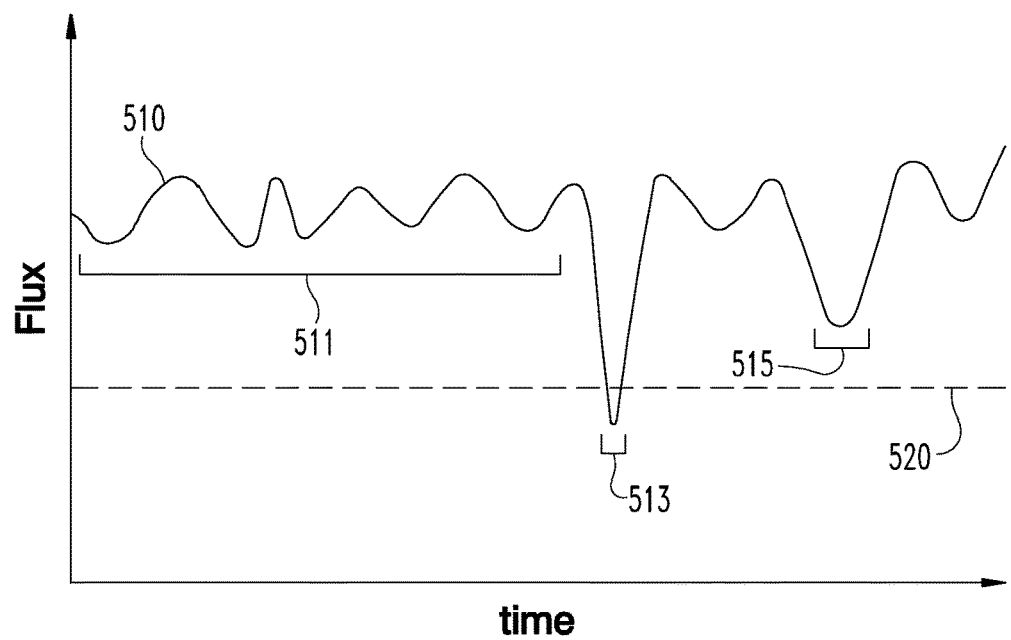
FIG. 5 is a graph of localized flux information.

With reference to FIG. 5 there is illustrated a graph of air gap flux linkage for a surface magnet permanent magnet motor (SMPMM) versus time. Flux waveform 510 illustrates substantially sinusoidal operation over range 511, and harmonically distorted behavior at locations 513 and 515. Waveform 510 may be evaluated relative to an instantaneous flux threshold 520 to identify an error condition indicating magnet degradation or damage attributable to elevated temperature, physical damage or chemical damage. The error condition may be determined by sampling the value of waveform 510 at discrete points and comparing the sampled value to the instantaneous flux threshold 520.

Figure 6:
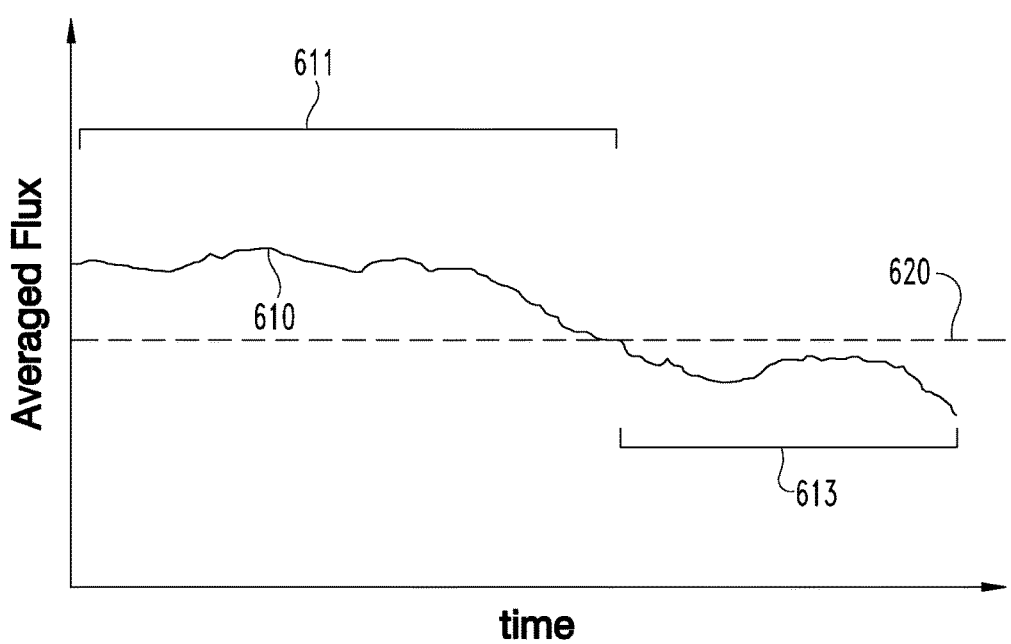
FIG. 6 is a graph of collective flux information.

With reference to FIG. 6 there is illustrated a graph of RMS average air gap flux for a SMPMM versus time. Flux curve 610 illustrates RMS averaged flux which can be evaluated relative to averaged flux threshold 620. Any point on curve 610 may be evaluated relative to an averaged flux threshold 620 to identify acceptable operation, such as over range 611, or an error condition indicating magnet degradation or damage, such as over range 613. The degradation or damage may be attributable to elevated temperature, physical damage or chemical damage.

It shall be understood that the exemplary embodiments summarized and described in detail above and illustrated in the figures are illustrative and not limiting or restrictive. Only the presently preferred embodiments have been shown and described and all changes and modifications that come within the scope of the invention are to be protected. It shall be appreciated that the embodiments and forms described below may be combined in certain instances and may be exclusive of one another in other instances. Likewise, it shall be appreciated that the embodiments and forms described below may or may not be combined with other aspects and features disclosed elsewhere herein. It should be understood that various features and aspects of the embodiments described above may not be necessary and embodiments lacking the same are also protected. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A system comprising:
   a permanent magnet motor including a stator including a plurality of windings electrically coupled to terminals and a rotor including a plurality of permanent magnets;
   a motor drive including a plurality of outputs electrically coupled with the terminals;
   a controller configured to provide control signals to the motor drive and receive sensed information relating to operation of the permanent magnet motor;
   wherein the controller is configured to determine a magnetic flux value using a calculation based upon motor voltage information and motor current information, and the controller is configured to evaluate an elevated temperature error condition of one or more of the plurality of permanent magnets based upon the magnetic flux value and a magnetic flux threshold;
   wherein the magnetic flux value is an averaged magnetic flux value.

2. The system of claim 1 wherein the magnetic flux information comprises a flux linkage for the air gap intermediate the rotor and the stator.

3. The system of claim 1 wherein the controller is configured to determine d-axis current information, q-axis current information, and q-axis voltage information based upon sensed motor current and sensed terminal voltage, and to determine the magnetic flux information based upon the d-axis current information, the q-axis current information, the q-axis voltage information, d-axis inductance information, and stator resistance information.

4. The system of claim 3 wherein the calculation of the magnetic flux value comprises:

calculation of a q-axis flux in accordance with the equation $Fq = \int (Vq - (Iq*Rs)) \, dt - (Id*Ld)$; and calculation of a d-axis flux in accordance with the equation $Fd = \int (Vd - (Id*Rs)) \, dt - (Iq*Lq)$;

wherein Fq is the q-axis flux, Fd is the d-axis flux, Vq is the q-axis motor voltage, Vd is the d-axis motor voltage, Iq is the q-axis motor current, Id is the d-axis motor current, Lq is the q-axis motor inductance, Ld is the d-axis motor inductance, and Rs is the motor stator resistance.

5. The system of claim 3 wherein the d-axis current information, the q-axis current information, and the q-axis voltage information are defined in a rotating coordinate system.

6. The system of claim 1 wherein the calculation to determine the magnetic flux value is independent of frequency information.

7. The system of claim 6 wherein the calculation to determine the magnetic flux value consists essentially of integration operations, multiplication operations, and addition or subtraction operations.

8. The system of claim 6 wherein the calculation to determine the magnetic flux value excludes division operations.

9. The system of claim 1 wherein the magnetic flux information comprises an axial gap magnetic flux of the motor.

10. An apparatus comprising:
    a non-transitory computer readable medium configured with instructions executable by a computer to:
    operate a motor drive to drive a permanent magnet motor including a plurality of permanent magnets;
    perform a calculation of a magnetic flux based upon motor current, motor voltage, motor inductance and motor resistance, the calculation being independent of motor frequency;
    determine an over temperature error condition of one or more of the plurality of permanent magnets based upon the magnetic flux;
    wherein the magnetic flux of the calculation is an averaged magnetic flux.

11. The apparatus of claim 10 wherein the magnetic flux is evaluated relative to a threshold to determine the over temperature condition.

12. The apparatus of claim 11 wherein the threshold is one of based upon a measurement of an individual motor and adjustable during operation.

13. The apparatus of claim 11 wherein the threshold is determined by an artificial intelligence algorithm which adjusts the threshold based upon feedback from iterative operations using predetermined boundaries as a guideline.

14. A method comprising:
    operating a system comprising a permanent magnet motor and a motor drive, the permanent magnet motor comprising a stator including a plurality of windings electrically coupled to terminals and a rotor including a plurality of permanent magnets, the motor drive including a plurality of outputs electrically coupled with the terminals;
    determining a magnetic flux value based upon information indicative of a motor current, information indicative of a terminal voltage, information indicative of a motor inductance, and information indicative of a motor resistance; and
    identifying an over temperature error condition associated with the plurality of permanent magnets based upon the magnetic flux value;

wherein the magnetic flux value is an averaged magnetic flux value.

15. The method of claim 14 wherein the magnetic flux value comprises flux linkage for the air gap intermediate the rotor and the stator.

16. The method of claim 14 wherein the act of determining the magnetic flux value is independent of motor frequency.

17. The method of claim 14 further comprising determining d-axis current information, q-axis current information, and q-axis voltage information based upon sensed motor operation information;

wherein the act of determining the magnetic flux information is based upon the d-axis current information, the q-axis current information, the q-axis voltage information, d-axis inductance information, and stator resistance information; and wherein the act of determining magnetic flux information comprises:
multiplying the q-axis current information and the stator resistance information to determine a first product value,
subtracting the first product value from the q-axis voltage information to determine a difference value,
integrating the difference value over time to determine an integration value,
multiplying the d-axis current information and the d-axis inductance to determine a second product value, and
determining the flux value by subtracting the second product value from the integration value.

18. The method of claim 17 wherein the over temperature error condition associated with the plurality of permanent magnets is determined by evaluating the magnetic flux value relative to a threshold value.

* * * * *